United States Patent
Yuasa et al.

(10) Patent No.: US 7,426,098 B2
(45) Date of Patent: Sep. 16, 2008

(54) MAGNETORESISTIVE ELEMENT HAVING THREE-LAYER BUFFER LAYER, MAGNETIC HEAD, MAGNETIC REPRODUCING APPARATUS, AND MAGNETIC MEMORY

(75) Inventors: Hiromi Yuasa, Yokohama (JP); Hideaki Fukuzawa, Sagamihara (JP); Susumu Hashimoto, Ebina (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 471 days.

(21) Appl. No.: 11/017,965

(22) Filed: Dec. 22, 2004

(65) Prior Publication Data

US 2005/0168887 A1    Aug. 4, 2005

(30) Foreign Application Priority Data

Dec. 25, 2003   (JP)   ............... 2003-431571

(51) Int. Cl.
G11B 5/33    (2006.01)
G11B 5/127   (2006.01)

(52) U.S. Cl. .................. 360/324.12; 338/32 R; 324/252; 324/207.21

(58) Field of Classification Search .... 360/324–324.12; 324/207.21, 252; 338/32 R
See application file for complete search history.

(56) References Cited

U.S. PATENT DOCUMENTS

| | | | | |
|---|---|---|---|---|
| 5,608,593 A * | 3/1997 | Kim et al. | ............... | 360/324.12 |
| 6,080,445 A * | 6/2000 | Sugiyama et al. | ......... | 427/249.7 |
| 6,313,973 B1 * | 11/2001 | Fuke et al. | ............... | 360/324.1 |
| 6,411,476 B1 * | 6/2002 | Lin et al. | ............... | 360/324.11 |
| 6,452,763 B1 * | 9/2002 | Gill | .................. | 360/324.11 |
| 6,775,111 B2 * | 8/2004 | Lin et al. | ............... | 360/324.11 |
| 6,784,509 B2 | 8/2004 | Yuasa et al. | | |
| 6,785,103 B2 * | 8/2004 | Cornwell et al. | ........ | 360/324.12 |
| 6,788,499 B2 * | 9/2004 | Lin et al. | ................. | 360/324.1 |

(Continued)

FOREIGN PATENT DOCUMENTS

CN    1431651 A    7/2003

(Continued)

OTHER PUBLICATIONS

M. Takagishi, et al., "The Applicability of CPP-GMR Heads for Magnetic Recording", IEEE Transactions on Magnetics, vol. 38, No. 5, Sep. 2002, pp. 2277-2282.

(Continued)

Primary Examiner—Brian E. Miller
Assistant Examiner—Matthew G Kayrish
(74) Attorney, Agent, or Firm—Oblon, Spivak, McClelland, Maier & Neustadt, P.C.

(57) ABSTRACT

A magnetoresistive element includes a magnetoresistive film having a magnetization pinned layer whose magnetization is substantially pinned to one direction, a nonmagnetic intermediate layer, and a magnetization free layer whose magnetization is changed in direction depending on an external magnetic field, in which the magnetization pinned layer or nonmagnetic intermediate layer includes an insulator, and a pair of electrodes electrically connected to the magnetoresistive film so as to supply a sense current in a direction substantially perpendicular to a plane of the magnetoresistive film. The magnetization free layer includes a body-centered cubic layer with a body-centered cubic structure, and the thickness of the body-centered cubic layer is 2 nm or more.

9 Claims, 10 Drawing Sheets

U.S. PATENT DOCUMENTS

| | | | |
|---|---|---|---|
| 6,833,981 B2 * | 12/2004 | Suwabe et al. | 360/324.1 |
| 6,961,224 B2 * | 11/2005 | Pinarbasi | 360/324.11 |
| 7,116,529 B2 * | 10/2006 | Yoshikawa et al. | 360/324.1 |
| 7,180,714 B2 * | 2/2007 | Gill | 360/324.1 |
| 7,221,545 B2 * | 5/2007 | Gill | 360/324.11 |
| 2002/0048128 A1 * | 4/2002 | Kamiguchi et al. | 360/324.1 |
| 2002/0051380 A1 | 5/2002 | Kamiguchi et al. | |
| 2002/0150791 A1 * | 10/2002 | Yuasa et al. | 428/692 |
| 2002/0151791 A1 * | 10/2002 | Nozaki et al. | 600/437 |
| 2004/0021990 A1 | 2/2004 | Koui et al. | |

FOREIGN PATENT DOCUMENTS

| | | |
|---|---|---|
| JP | 11-86229 | 3/1999 |
| JP | 2003-60263 | 2/2003 |

OTHER PUBLICATIONS

K. Nagasaka, et al., "Giant magnetoresistance properties of specular spin valve films in a current perpendicular to plane structure", Journal of Applied Physics, vol. 89, No. 11, Jun. 1, 2001, pp. 6943-6945.

H. Yuasa, et al., "Output enhancement of spin-valve giant magnetoresistance in current-perpendicular-to-plane geometry", Journal of Applied Physics, vol. 92, No. 5, Sep. 1, 2002, pp. 2646-2650.

Hideaki Fukuzawa, et al., "MR Ratio Enhancement by NOL Current-Confined-Path Structures in CPP Spin Valves", IEEE Transactions on Magnetics, vol. 40, No. 4, Jul. 2004, pp. 2236-2238.

* cited by examiner

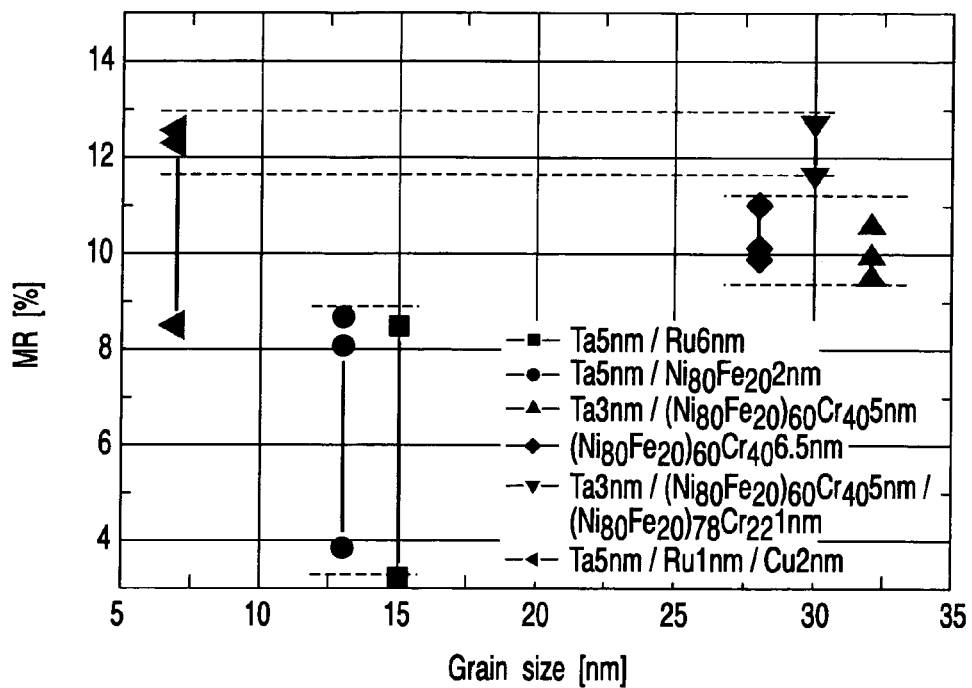
F I G. 8A
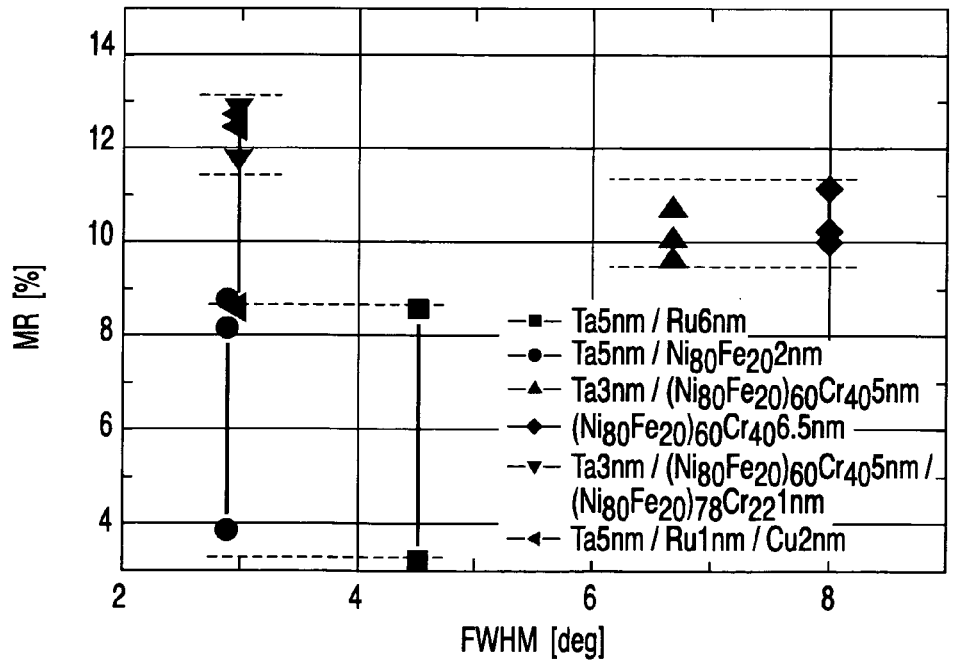
F I G. 8B

MAGNETORESISTIVE ELEMENT HAVING THREE-LAYER BUFFER LAYER, MAGNETIC HEAD, MAGNETIC REPRODUCING APPARATUS, AND MAGNETIC MEMORY

CROSS-REFERENCE TO RELATED APPLICATIONS

This application is based upon and claims the benefit of priority from prior Japanese Patent Application No. 2003-431571, filed Dec. 25, 2003, the entire contents of which are incorporated herein by reference.

BACKGROUND OF THE INVENTION

1. Field of the Invention

The present invention relates to a magnetoresistive element, a magnetic head, a magnetic reproducing apparatus, and a magnetic memory, and more particularly to a magnetoresistive element having a structure adapted to flow a sense current in a direction perpendicular to the plane of a magnetoresistive film, and a magnetic head, a magnetic reproducing apparatus, and a magnetic memory using the magnetoresistive element.

2. Description of the Related Art

Recently, since a relative speed between a read head and a magnetic recording medium in reading information becomes lower with reduction in size and increase in capacity of a magnetic recording medium, it is expected to develop a magnetoresistive (MR) head capable of producing a high output even under a low relative speed.

On the other hand, it has been reported that a high magnetoresistive effect is realized in a multilayer film having a sandwich structure of ferromagnetic layer/nonmagnetic layer/ferromagnetic layer in the case where the ferromagnetic layers are not antiferromagnetically coupled. With regard to the two ferromagnetic layers sandwiching a nonmagnetic layer (referred to as a "spacer layer" or an "intermediate layer"), the magnetization of one ferromagnetic layer (referred to as "pinned layer" or "magnetization pinned layer") is pinned by applying an exchange bias magnetic field, while the magnetization of the other ferromagnetic layer (referred to as "free layer" or "magnetization free layer") can be reversed by an external magnetic field (for example, signal magnetic field). In this multilayer film, a high magnetoresistive effect can be obtained by changing a relative angle between the magnetization directions of the two ferromagnetic layers having the nonmagnetic layer interposed therebetween. The multilayer film of this type is referred to as a "spin-valve".

The spin-valve can reach magnetization saturation in a low magnetic field, which is suited to an MR head, and has been already put in practical use. However, its magnetoresistive ratio is about 20% at maximum, and therefore a magnetoresistive element with a higher magnetoresistive ratio has been demanded.

The magnetoresistive element includes two types of structures, that is, a CIP (current-in-plane) type adapted to flow a sense current in a parallel direction to the film plane of the element, and a CPP (current-perpendicular-to-plane) type adapted to flow a sense current in a perpendicular direction to the film plane of the element. The CPP magnetoresistive element has been reported to show a magnetoresistive ratio of about 10 times that of the CIP magnetoresistive element, and it is not impossible to achieve the magnetoresistive ratio of 100%.

In the spin-valve structure, however, since the total thickness of spin-dependent layers is very small and the number of interfaces is few, the resistance itself is low and the absolute value of the output is also low when a current is supplied to the CPP magnetoresistive element in the perpendicular direction. In the case where a spin-valve having a structure used in the conventional CPP magnetoresistive element is supplied with a current in the perpendicular direction, the absolute value of the output, i.e., $A\Delta R$ per $\mu m^2$, is as low as about 0.5 $m\Omega$ $\mu m^2$ for the pinned and free layers having a thickness of 5 nm. In other words, in order to realize a CPP magnetoresistive element using a spin-valve film, it is important to increase the output. To this end, it is very important to raise the resistance value of the portions related to spin-dependent conduction and increase the resistance change in the magnetoresistive element.

By contrast, to enhance the magnetoresistive (MR) effect, it has been proposed to insert a resistance adjusting layer containing an insulator in the spin-valve film (see J. Appl. Phys., 89, p. 6943, 2001, or IEEE Trans. Magn., 38, p. 2277, 2002). The spin-valve includes a portion related to spin-dependent scattering of electrons (pinned layer/spacer layer/free layer), and a portion with low spin-dependent scattering (buffer layer, antiferromagnetic layer, protective layer, etc.). When the resistance of the former portion is Rsd and that of the latter portion is Rsi, the magnetoresistive ratio MR of the spin-valve may be expressed as $MR=\Delta Rsd/(Rsi+Rsd)$. The aforementioned insertion of the resistance adjusting layer containing the insulator has aimed at the effect that the more Rsd is greater than Rsi, the higher is the MR.

The resistance adjusting layer includes a portion of an insulator where a current does not flow, and low-resistance portions (metal paths) through which the current flows. The current is confined toward the metal paths in the vicinity of the resistance adjusting layer. This is called a current confinement effect. It is only the vicinity of the resistance adjusting layer that the resistance is raised by the current confinement effect, and the spin-dependent scattering at a position remote from the resistance adjusting layer hardly contributes to the MR. Thus, it is effective to arrange a material exhibiting high spin-dependent scattering in the vicinity of the resistance adjusting layer.

However, since a material exhibiting high spin-dependent scattering is often poor in magnetic characteristics, the material is hard to use for a free layer (see Jpn. Pat. Appln. KOKAI Publication No. 2003-60263). In the spin-valve, excellent magnetic characteristics are required for the free layer. In order to read the signal magnetic field from the magnetic recording medium at high sensitivity, the free layer is required to have soft magnetic characteristics, such as a low coercivity, and low magnetostriction. These magnetic characteristics depend on the material and crystallinity of the free layer. To satisfy the magnetic characteristics in the material with a high MR, it is important to control the crystallinity of the free layer.

The following characteristics are required for the resistance adjusting layer inserted in the central portion of the spin-valve, according to the technique disclosed in J. Appl. Phys., 89, p. 6943, 2001 or IEEE Trans. Magn., 38, p. 2277, 2002. First, the insulating portion should be high-quality. In the CPP type magnetoresistive element, since a current is allowed to flow perpendicular to the film plane, the resistance adjusting layer is required to have high voltage endurance characteristics. Second, the conductive portions (metal paths) should also be high-quality. If the metal paths contain impurities by which electrons with a spin are scattered, the MR will be lowered. Thus, the metal paths should have the highest purity possible. The grain size and crystal orientation of a portion of the spin-valve located under the resistance adjusting layer determines the quality of the insulator and metal paths. Therefore, it is important to control the grain size and crystal orientation of the layer located under the resistance adjusting layer.

Accordingly, in the spin-valve including the insulator, it is important to control the grain size and crystal orientation in order to satisfy both the high MR and magnetic characteristics of the free layer.

BRIEF SUMMARY OF THE INVENTION

A magnetoresistive element according to one aspect of the present invention comprises: a magnetoresistive film comprising: a magnetization pinned layer whose magnetization is substantially pinned to one direction; a nonmagnetic intermediate layer formed on the magnetization pinned layer; and a magnetization free layer, formed on the nonmagnetic intermediate layer, whose magnetization is changed in direction depending on an external magnetic field, the magnetization pinned layer or nonmagnetic intermediate layer comprising an insulator; and a pair of electrodes electrically connected to the magnetoresistive film so as to supply a sense current in a direction substantially perpendicular to a plane of the magnetoresistive film, the magnetization free layer comprising a body-centered cubic layer with a body-centered cubic structure, and the thickness of the body-centered cubic layer being 2 nm or more.

A magnetoresistive element according to another aspect of the present invention comprises: a magnetoresistive film comprising: a buffer layer; an antiferromagnetic layer formed on the buffer layer; a magnetization pinned layer, formed on the antiferromagnetic layer, whose magnetization is substantially pinned to one direction; a nonmagnetic intermediate layer formed on the magnetization pinned layer; and a magnetization free layer, formed on the nonmagnetic intermediate layer, whose magnetization is changed in direction depending on an external magnetic field, at least one layer of the magnetization pinned layer, nonmagnetic intermediate layer and magnetization free layer comprising an insulator; and a pair of electrodes electrically connected to the magnetoresistive film so as to supply a sense current in a direction substantially perpendicular to a plane of the magnetoresistive film, the buffer layer comprising three types of layers selected from the group consisting of Ta, $(Ni_{100-x}Fe_x)_{100-y}Cr_y$ alloy ($15 \leq x \leq 25$, $20 \leq y \leq 30$), $(Ni_{100-x}Fe_x)_{100-y}Cr_y$ alloy ($15 \leq x \leq 25$, $30 < y \leq 45$), Cu, Ru, and $Co_{100-x}Fe_x$ ($5 < x < 15$).

In this specification, the word "on" may refer either one or two structural relations between two layers, such as two layers in contact with each other in a first structural relation, and two layers not in contact and have other layer(s) between the two layers in a second structural relation.

BRIEF DESCRIPTION OF THE SEVERAL VIEWS OF THE DRAWING

FIG. 8A is a diagram showing the relationship between the grain size and MR;

FIG. 8B is a diagram showing the relationship between FWHM and MR;

DETAILED DESCRIPTION OF THE INVENTION

The invention will be more specifically described below with reference to following embodiments.

First Embodiment

Figure 1:
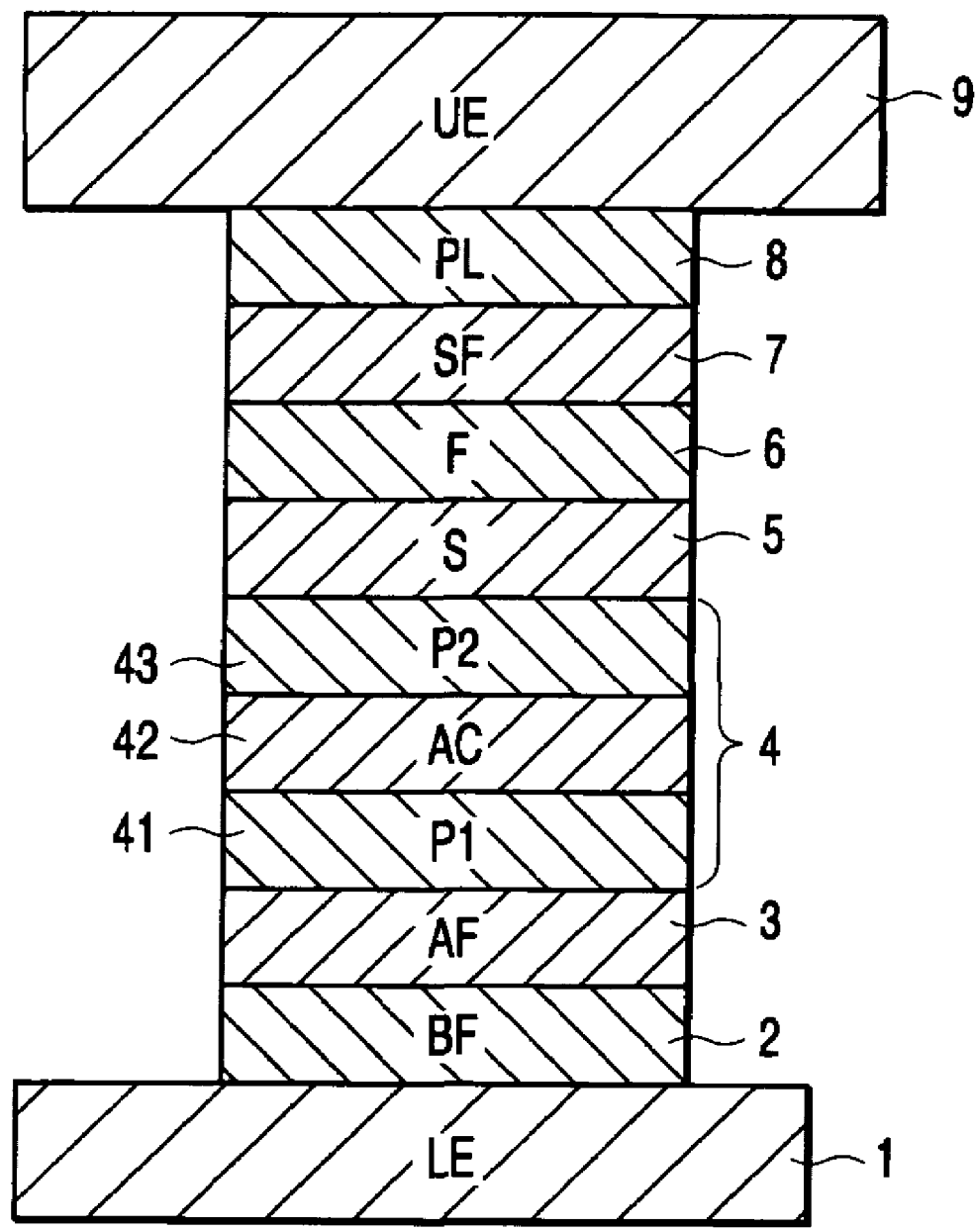
FIG. 1 is a sectional view of a magnetoresistive element for reference.

Prior to explanation of a magnetoresistive element according to the invention, a magnetoresistive element for reference is described. FIG. 1 is a sectional view of the magnetoresistive element for reference.

The magnetoresistive element (spin-valve) in FIG. 1 has a stacked structure comprising a lower electrode (LE) 1, a buffer layer (BF) 2, an antiferromagnetic layer (AF) 3, a pinned layer 4 [a first pinned layer (P1) 41, an anti-parallel coupling layer (AC) 42, and a second pinned layer (P2) 43], a spacer layer (S) 5, a free layer (F) 6, a spin filter layer (SF) 7, a protective layer (PL) 8, and an upper electrode (UE) 9.

The first pinned layer 41 has magnetization substantially pinned in one direction by the adjacent antiferromagnetic layer 3, and the second pinned layer 43 has magnetization pinned in the direction opposite to that of the first pinned layer 41 through the anti-parallel coupling layer 42. The free layer 6 includes a ferromagnetic layer whose magnetization direction is variable depending on an external magnetic field. The spacer layer 5 is a layer interrupting magnetic coupling between the second pinned layer 43 and the free layer 5. In the magnetoresistive element in FIG. 1, the spacer layer 5 is formed of metal only.

The magnetoresistive element having the structure shown in FIG. 1 was manufactured by use of the following materials:
Buffer layer 2: Ta [5 nm]/Ru [2 nm]
Antiferromagnetic layer 3: PtMn [15 nm]
First pinned layer 41: $Co_{90}Fe_{10}$ [3 to 4 nm]
Anti-parallel coupling layer 42: Ru [1 nm]
Second pinned layer 43: described in Table 1
Spacer layer 5: Cu [3 nm]
Free layer 6: described in Table 1
Spin filter layer 7: Cu [1 nm]
Protective layer 8: Ru [5 nm].

The thickness of the first pinned layer 41 was varied depending on the saturation magnetization of the second pinned layer 43. The material and thickness of the second pinned layer 43 and free layer 5 were varied as shown in Table 1. The magnetoresistance change of the magnetoresistive element and the coercivity Hc of the free layer 5 are also shown in Table 1. Since the entire resistance is low in the spin-valve having no resistance adjusting layer, the output of the spin valve is expressed by the magnetoresistance change (AΔR) per unit area in Table 1 for ease of understanding.

TABLE 1

| | Film material | | Results | |
|---|---|---|---|---|
| Sample | Second pinned layer | Free layer | AΔR [mΩ μm²] | Hc [Oe] |
| 1 | $Co_{90}Fe_{10}$ 3 nm | $Co_{90}Fe_{10}$ 3 nm | 0.8 | 7 |
| 2 | $Co_{90}Fe_{10}$ 3 nm | $Ni_{80}Fe_{20}$ 5 nm | 0.5 | 3 |
| 3 | $Co_{90}Fe_{10}$ 3 nm | $Co_{90}Fe_{10}$ 1 nm/ $Ni_{80}Fe_{20}$ 3.5 nm | 0.6 | 3 |
| 4 | $Fe_{50}Co_{50}$ 3 nm | $Fe_{50}Co_{50}$ 3 nm | 1.7 | 40 |
| 5 | $Fe_{50}Co_{50}$ 3 nm | $Fe_{50}Co_{50}$ 2 nm/ $Ni_{80}Fe_{20}$ 3.5 nm | 1.5 | 20 |
| 6 | $Fe_{50}Co_{50}$ 3 nm | $Fe_{50}Co_{50}$ 1 nm/ $Ni_{80}Fe_{20}$ 3.5 nm | 1.3 | 10 |
| 7 | $Fe_{50}Co_{50}$ 3 nm | $Fe_{80}Co_{20}$ 3 nm | 1.7 | 30 |
| 8 | $Fe_{50}Co_{50}$ 3 nm | $Fe_{80}Co_{20}$ 2 nm/ $Ni_{80}Fe_{20}$ 3.5 nm | 1.5 | 17 |
| 9 | $Fe_{50}Co_{50}$ 3 nm | $Fe_{80}Co_{20}$ 1 nm/ $Ni_{80}Fe_{20}$ 3.5 nm | 1.3 | 8 |
| 10 | $Fe_{50}Co_{50}$ 3 nm | Fe 3 nm | 1.6 | 20 |
| 11 | $Fe_{50}Co_{50}$ 3 nm | Fe 2 nm/ $Ni_{80}Fe_{20}$ 3.5 nm | 1.4 | 10 |
| 12 | $Fe_{50}Co_{50}$ 3 nm | Fe 1 nm/ $Ni_{80}Fe_{20}$ 3.5 nm | 1.2 | 5 |

Results in Table 1 show the following.

(1) Comparing Samples 1, 2 and 3, the magnetoresistive elements including the $Ni_{80}Fe_{20}$ free layer have lower AΔR as compared with magnetoresistive element including the $Co_{90}Fe_{10}$ free layer. As shown in Samples 2 and 3, when the free layer includes $Co_{90}Fe_{10}$ layer at the interface with the spacer layer, decrease of spin-dependent interface scattering can be compensated. However, since the loss by spin-dependent bulk scattering is high in Samples 2 and 3, AΔR is lower than that in Sample 1. The coercivity is low in the $Ni_{80}Fe_{20}$ free layer.

(2) Comparing Samples 1, 2 and 4, it is found that MR is increased by varying the materials of the second pinned layer and free layer. AΔR is the highest when $Fe_{50}Co_{50}$ is used, and AΔR is relatively high when $Co_{90}Fe_{10}$ is used, but AΔR is low when $Ni_{80}Fe_{20}$ is used. However, the higher the AΔR, the higher the coercivity. In particular, since $Fe_{50}Co_{50}$, $Fe_{80}Co_{20}$ or Fe, whose crystal structure is the body-centered cubic, has the coercivity of 20 Oe or more, the magnetoresistive element having the structure in FIG. 1 using such materials cannot be practically used as a magnetoresistive head.

(3) Comparing Samples 4 to 12, it is found that the coercivity can be decreased by combining the material of the body-centered cubic material described in (2) and $Ni_{80}Fe_{20}$ with low coercivity. Furthermore, Hc can be lowered by reducing the thickness of the body-centered cubic material such as $Fe_{50}Co_{50}$, $Fe_{80}Co_{20}$ and Fe in the free layer, while AΔR decreases at the same time. This is mainly because a part of the material exhibiting high spin-dependent bulk scattering such as $Fe_{50}Co_{50}$, $Fe_{80}Co_{20}$ and Fe is replaced with $Ni_{80}Fe_{20}$ exhibiting low scattering. Also, that is partly because the body-centered cubic crystal of $Fe_{50}Co_{50}$, $Fe_{80}Co_{20}$ or Fe that is made thinner becomes unstable and the spin-dependent interface scattering or spin-dependent bulk scattering is lowered.

In the case of the spin valve with 3 nm body-centered cubic materials $Fe_{50}Co_{50}$, $Fe_{80}Co_{20}$ or Fe, however, the coercivity of the free layer becomes too large. Therefore, it is necessary to apply the body-centered cubic material with thickness of less than about 3 nm, preferably less than about 2.5 nm.

A similar tendency is given in other combination of materials. For example, a similar tendency as above is confirmed in a free layer formed of a stacked film of a $(Fe_{100-x}Co_x)_{100-y}Ni_y$ layer ($0 \leq x \leq 85$, $0 < y < 50$) in contact with the spacer and a $Ni_{100-x}Fe_x$ layer ($15 \leq x \leq 25$) remote from the spacer.

If an additive element (at least one selected from the group consisting of Cu, Au, Ag, Pt, Re and B, referred to as M1 hereinafter) is added to the ferromagnetic layer used as the free layer in the range of more than 0% and less than 10%, AΔR can be increased, while the relationship between AΔR and Hc remains to be in the same tendency as above.

Further, if an M1 metal layer (where M1 is at least one selected from the group consisting of Cu, Au, Ag, Pt, Re and B) with a thickness of one atomic layer or more and 1 nm or less is inserted in the ferromagnetic layer used as the free layer, AΔR can be increased, while the relationship between AΔR and Hc also remains to be in the same tendency as above.

Figure 2:
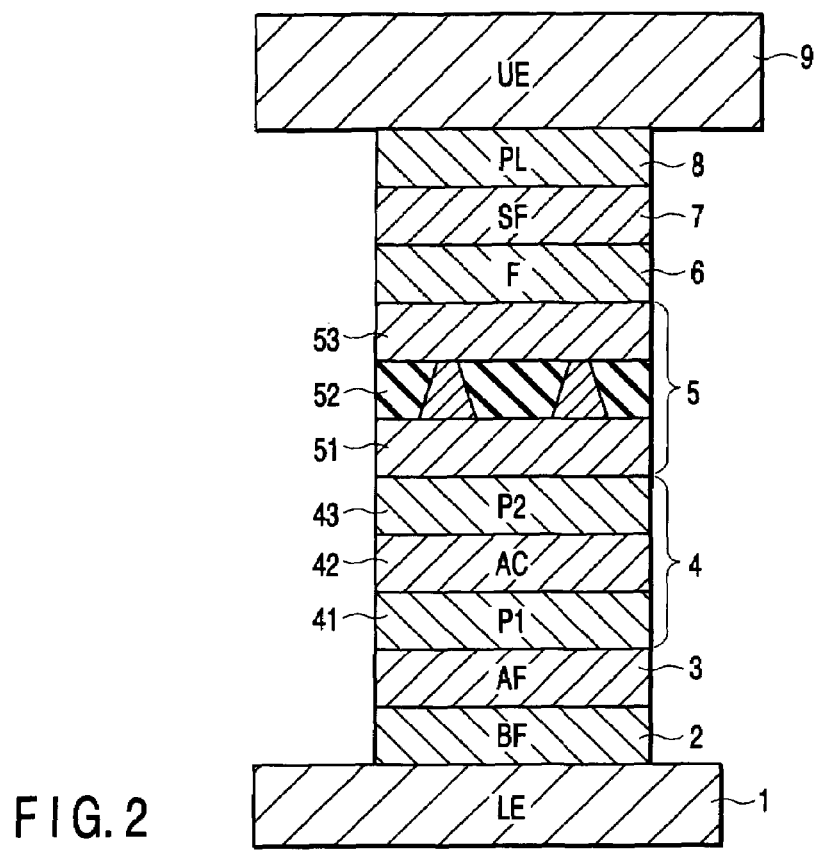
FIG. 2 is a sectional view of a magnetoresistive element according to an embodiment of the present invention.

A magnetoresistive element according to an embodiment of the present invention will be described. FIG. 2 is a sectional view showing a magnetoresistive element according to an embodiment of the present invention.

The magnetoresistive element (spin-valve) in FIG. 2 has a stacked structure comprising a lower electrode (LE) 1, a buffer layer (BF) 2, an antiferromagnetic layer (AF) 3, a pinned layer 4 [a first pinned layer (P1) 41, an anti-parallel coupling layer (AC) 42, and a second pinned layer (P2) 43], a spacer layer (S) 5 [a first metal layer 51, a resistance increasing layer 52, and a second metal layer 53], a free layer (F) 6, a spin filter layer (SF) 7, a protective layer (PL) 8, and an upper electrode (UE) 9. A sense current is applied through the lower electrode 1 and upper electrode 9 in the substantially perpendicular direction to the magnetoresistive film, thus the CPP magnetoresistive element is realized.

The first pinned layer 41 has magnetization substantially pinned in one direction by the adjacent antiferromagnetic layer 3, and the second pinned layer 43 has magnetization pinned in the direction opposite to the first pinned layer 41 through the anti-parallel coupling layer 42. The free layer 6 includes a ferromagnetic layer whose magnetization direction is variable depending on an external magnetic field. The spacer layer 5 is a layer interrupting magnetic coupling between the second pinned layer 43 and the free layer 5. In the magnetoresistive element shown in FIG. 2, the spacer layer 5 has a stacked structure of a first metal layer 51, a resistance increasing layer 52, and a second metal layer 53. The resistance increasing layer 52 includes an insulator and metal paths.

The magnetoresistive element having the structure shown in FIG. 2 was manufactured by use of the following materials:
Buffer layer 2: Ta [5 nm]/Ru [2 nm]
Antiferromagnetic layer 3: PtMn [15 nm]
First pinned layer 41: $Co_{90}Fe_{10}$ [3 to 4 nm]
Anti-parallel coupling layer 42: Ru [1 nm]
Second pinned layer 43: described in Table 2
First metal layer 51: Cu [0.2 nm]
Resistance increasing layer 52: $AlO_x$ including Cu metal paths [1.5 nm]
Second metal layer 53: Cu [0.5 nm]
Free layer 6: described in Table 2
Spin filter layer 7: Cu [1 nm]
Protective layer 8: Ru [5 nm].

The thickness of the first pinned layer 41 was varied depending on the saturation magnetization of the second pinned layer 43. The material and thickness of the second pinned layer 43 and free layer 6 were varied as shown in Table 2. The magnetoresistive ratio MR [%](=AΔR/AR) of the magnetoresistive element and the coercivity Hc of the free layer 6 are also shown in Table 2.

TABLE 2

| | Film material | | Results | |
|---|---|---|---|---|
| Sample | Second pinned layer | Free layer | MR [%] | Hc [Oe] |
| 13 | $Co_{90}Fe_{10}$ 3 nm | $Co_{90}Fe_{10}$ 3 nm | 4.0 | 7.0 |
| 14 | $Co_{90}Fe_{10}$ 3 nm | $Ni_{80}Fe_{20}$ 5 nm | 2.0 | 3.0 |
| 15 | $Co_{90}Fe_{10}$ 3 nm | $Co_{90}Fe_{10}$ 1 nm/ $Ni_{80}Fe_{20}$ 3.5 nm | 4.0 | 5.0 |
| 16 | $Fe_{50}Co_{50}$ 3 nm | $Fe_{50}Co_{50}$ 3 nm | 10.0 | 13.0 |
| 17 | $Fe_{50}Co_{50}$ 3 nm | $Fe_{50}Co_{50}$ 2 nm/ $Ni_{80}Fe_{20}$ 3.5 nm | 9.5 | 6.0 |
| 18 | $Fe_{50}Co_{50}$ 3 nm | $Fe_{50}Co_{50}$ 1 nm/ $Ni_{80}Fe_{20}$ 3.5 nm | 8.5 | 4.0 |
| 19 | $Fe_{50}Co_{50}$ 3 nm | $Fe_{80}Co_{20}$ 3 nm | 10.0 | 9.0 |
| 20 | $Fe_{50}Co_{50}$ 3 nm | $Fe_{80}Co_{20}$ 2 nm/ $Ni_{80}Fe_{20}$ 3.5 nm | 9.5 | 5.0 |
| 21 | $Fe_{50}Co_{50}$ 3 nm | $Fe_{80}Co_{20}$ 1 nm/ $Ni_{80}Fe_{20}$ 3.5 nm | 8.5 | 3.0 |
| 22 | $Fe_{50}Co_{50}$ 3 nm | Fe 3 nm | 8.0 | 5.0 |
| 23 | $Fe_{50}Co_{50}$ 3 nm | Fe 2 nm/ $Ni_{80}Fe_{20}$ 3.5 nm | 7.4 | 3.0 |
| 24 | $Fe_{50}Co_{50}$ 3 nm | Fe 1 nm/ $Ni_{80}Fe_{20}$ 3.5 nm | 7.0 | 3.0 |

Results in Table 2 show the following.

(1) Comparing Samples 13, 14 and 15, it is found that the $Co_{90}Fe_{10}$ free layer has a high Hc. If $Ni_{80}Fe_{20}$ is used for the free layer Hc is decreased, but the MR is also decreased because $Ni_{80}Fe_{20}$ causes low spin-dependent interface scattering. When a stacked free layer of a $Co_{90}Fe_{10}$ layer in contact with the spacer and a $Ni_{80}Fe_{20}$ layer remote from the spacer was used to increase the spin-dependent interface scattering, an MR similar to that of the spin-valve having the free layer entirely formed of $Co_{90}Fe_{10}$ was obtained, and also Hc was decreased. As shown in Table 1 for the Samples 1, 2 and 3 having no resistance adjusting layer, however, even in the case where the stacked free layer of $Co_{90}Fe_{10}/Ni_{80}Fe_{20}$ was used, the AΔR did not reach the value of the spin-valve having the free layer entirely formed of $Co_{90}Fe_{10}$. Thus, the spin-valve having a resistance adjusting layer represents a phenomenon different from the spin-valve having no resistance adjusting layer. This is because the MR is roughly determined by the materials in the vicinity of the resistance adjusting layer in the Samples of Table 2 having a resistance adjusting layer with a current confinement effect.

(2) Samples 16 to 24 were manufactured to confirm the concept of satisfying both low Hc and high MR obtained in (1), in which $Fe_{50}Co_{50}$, $Fe_{80}Co_{20}$ and Fe serving to exhibit higher MR than $Co_{90}Fe_{10}$ were used for the free layer. $Fe_{50}Co_{50}$, $Fe_{80}Co_{20}$ and Fe are body-centered cubic materials and have a relatively high Hc. Samples 16 to 24, however, exhibited far lower Hc as compared with Samples 4 to 12 having a spacer of Cu 3 nm in Table 1. In particular, when a stacked free layer including $Ni_{80}Fe_{20}$ having a low coercivity, Hc could be lowered to a practical level. Since a ferromagnetic layer with Fe-rich composition intrinsically has a low Hc, the spin-valve having an Fe-rich free layer exhibited a low Hc without employing a stacked free layer including $Ni_{80}Fe_{20}$. This is because the crystal structure of the free layer is changed by using the spacer including the resistance adjusting layer. More specifically, it was found, from sectional TEM observation, that the grain size of the free layer was about 15 nm in the spin-valve having no resistance adjusting layer shown in FIG. 1, while the grain size of the free layer was as fine as about 7 nm or less in the spin-valve having the resistance adjusting layer shown in FIG. 2. In such a case, it is conceivable that Hc can be decreased even in the body-centered cubic alloy generally exhibiting high Hc. If the grain size is further reduced, a body-centered cubic material serving to exhibit high MR can be used in the free layer with a further thickness.

(3) Comparing Samples 16 to 24, MR is decreased by reducing the thickness of the body-centered cubic material $Fe_{50}Co_{50}$, $Fe_{80}Co_{20}$, Fe in the free layer, although the degree of decrease in MR is moderate as compared with the degree of decrease in AΔR in Table 1. As mentioned in (1), the spin-valve having a free layer of $Co_{90}Fe_{10}$ [1 nm]/$Ni_{80}Fe_{20}$ [3.5 nm] (sample 15) exhibited the same MR as in the spin-valve having a free layer entirely formed of $Co_{90}Fe_{10}$, due to insertion of 1 nm of $Co_{90}Fe_{10}$. By contrast, the spin-valve in which $Fe_{50}Co_{50}$, $Fe_{80}Co_{20}$ or Fe with a thickness of about 2 nm is inserted in the free layer (Sample 17, 20 or 23) exhibited slightly lowered MR. This is because the body-centered cubic crystal becomes unstable in a thin film. Therefore, it is necessary to use as thick a body-centered cubic material as possible to obtain a high MR.

In the case of the spin valve with 3 nm body-centered cubic materials $Fe_{50}Co_{50}$, $Fe_{80}Co_{20}$ or Fe, however, the coercivity of the free layer becomes too large. Therefore, it is necessary to apply the body-centered cubic material with thickness of less than about 3 nm, preferably less than about 2.5 nm.

In the above embodiments, the spin-valve elements having a resistance increasing layer formed in the spacer are described. However, spin-valve elements having a resistance increasing layer formed in the pinned layer can also be manufactured, and it is expected that such spin-valve elements provide the same effects as above.

A similar tendency is given in other combination of materials. For example, a similar tendency as above is confirmed in a free layer formed of a stacked film of a $(Fe_{100-x}Co_x)_{100-y}Ni_y$ layer (0≦x≦85, 0<y<50) in contact with the spacer and a $Ni_{100-x}Fe_x$ layer (15≦x<25) remote from the spacer. Practically, it may be effective to use for the free layer an alloy whose composition is slightly adjusted to reduce magnetostriction.

If an additive element (at least one selected from the group consisting of Cu, Au, Ag, Pt, Re and B, referred to as M1 hereinafter) is added to the ferromagnetic layer used as the free layer in the range of more than 0% and less than 10%, MR can be increased, while the relationship between MR and Hc remains to be in the same tendency as above.

Further, if an M1 metal layer (where M1 is at least one selected from the group consisting of Cu, Au, Ag, Pt, Re and B) with a thickness of one atomic layer or more and 1 nm or less is inserted in the ferromagnetic layer used as the free layer, MR can be increased, while the relationship between MR and Hc also remains to be in the same tendency as above.

Also, it is found that a higher MR can be obtained by modifying the pinned layer as follows: a $(Fe_{100-x}Co_x)_{100-y}Ni_y$ layer (0≦x≦85, 0≦y≦50) serving to exhibit a high MR is used for the pinned layer; an alloy obtained by adding to $(Fe_{100-x}Co_x)_{100-y}Ni_y$ an additive element M1 (where M1 is at least one selected from the group consisting of Cu, Au, Ag, Pt, Re and B) in the range of more than 0% and less than 10% is used for the pinned layer; and a stacked film having the M1 metal layer (where M1 is at least one selected from the group consisting of Cu, Au, Ag, Pt, Re and B) with a thickness of one atomic layer or more and 1 nm or less is inserted in the ferromagnetic layer is used for the pinned layer.

The resistance adjusting layer brings about similar effects as above when it includes at least two elements selected from the group consisting of Al, Cr, Mg, Hf, Zr, Si, Ta, Ti, V, Mo, W, Au, Ag, Cu, Pt, Nb, Re, Pd, B and C, and comprises an insulator formed of an oxide of a part of the elements.

From the above results, in order to satisfy both the high MR and the low Hc, it has been found effective to use a ferromagnetic layer selected from the following group consisting of (I) to (III) and the grain size thereof is as fine as 7 nm or less on a side in contact with the spacer in the free layer.

(I) A body-centered cubic $(Fe_{100-x}Co_x)_{100-y}Ni_y$ layer ($0 \leq x \leq 85$, $0 \leq y \leq 50$);

(II) A body-centered cubic $\{(Fe_{100-x}Co_x)_{100-y}Ni_y\}_{100-z}M1_z$ layer ($0 \leq x \leq 85$, $0 < y < 50$, $0 < z < 10$, where M1 is at least one selected from the group consisting of Cu, Au, Ag, Pt, Re and B); and (III) A ferromagnetically-coupled stacked layer in which at least one layer of M1 metal layer (where M1 is at least one selected from the group consisting of Cu, Au, Ag, Pt, Re and B) with a thickness of one atomic layer or more and 1 nm or less is inserted in the $(Fe_{100-x}Co_x)_{100-y}Ni_y$ layer ($0 \leq x \leq 85$, $0 \leq y \leq 50$).

It should be noted that, if the ferromagnetic layer of (I) to (III) is stacked with a $Ni_{100-x}Fe_x$ layer ($15 \leq x \leq 25$); a $(Ni_{100-x}Fe_x)_{100-z}M2_z$ layer ($15 \leq x < 25$, $0 < z < 10$, where M2 is at least one selected from the group consisting of Cu, Au, Ag, Pt, Re and B); or a stacked layer of a $Ni_{100-x}Fe_x$ layer ($15 \leq x \leq 25$) and at least one M2 metal layer (where M2 is at least one selected from the group consisting of Cu, Au, Ag, Pt, Re and B) with a thickness of one atomic layer or more and 1 nm or less, Hc is further decreased, but the MR tends to be decreased because the body-centered cubic crystal becomes unstable. To prevent the phenomenon, it is preferable to use a ferromagnetic layer with a Fe-rich composition intrinsically exhibiting a low Hc.

Moreover, if the body-centered cubic material $(Fe_{100-x}Co_x)_{100-y}Ni_y$ ($0 \leq x \leq 85$, $0 \leq y \leq 50$) is added with an element selected from the group consisting of Cu, Au, Ag, Pt, Re and B or stacked with a layer formed of an element selected from the group consisting of Cu, Au, Ag, Pt, Re and B, the Hc can be decreased by about 50% to 70%. Hence, such materials seem to be appropriate for providing a high MR and a low Hc.

Second Embodiment

Figure 3:
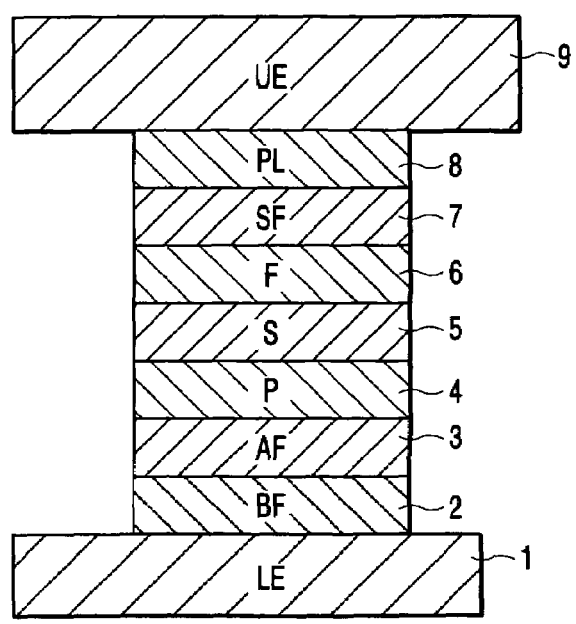
FIG. 3 is a sectional view of the magnetoresistive element for reference.

FIG. 3 is a sectional view of a magnetoresistive element for reference made of only metal layers having no insulating layer.

The magnetoresistive element (spin-valve) in FIG. 2 has a stacked structure comprising a lower electrode (LE) 1, a buffer layer (BF) 2, an antiferromagnetic layer (AF) 3, a pinned layer (P) 4, a spacer layer (S) 5, a free layer (F) 6, a spin filter layer (SF) 7, a protective layer (PL) 8, and an upper electrode (UE) 9.

The magnetoresistive element with the structure shown in FIG. 3 was manufactured using the following materials:
Buffer layer 2: described below
Antiferromagnetic layer 3: PtMn [15 nm]
Pinned layer 4: $Fe_{50}Co_{50}$ [5 nm]
Spacer layer 5: Cu [5 nm]
Free layer 6: $Fe_{50}Co_{50}$ [5 nm]
Spin filter layer 7: Cu [1 nm]
Protective layer 8: Ta [20 nm].

The following four materials were used for the buffer layer:
Ta [5 nm]/Ru [6 nm],
Ta [5 nm]/$Ni_{80}Fe_{20}$ [2 nm],
Ta [3 nm]/$(Ni_{80}Fe_{20})_{60}Cr_{40}$ [5 nm], and $(Ni_{80}Fe20)_{60}Cr_{40}$ [6.5 nm].

The magnetoresistive elements using these materials for the buffer layer are called 1-A, 1-B, 1-C, and 1-D, respectively.

Figure 4:
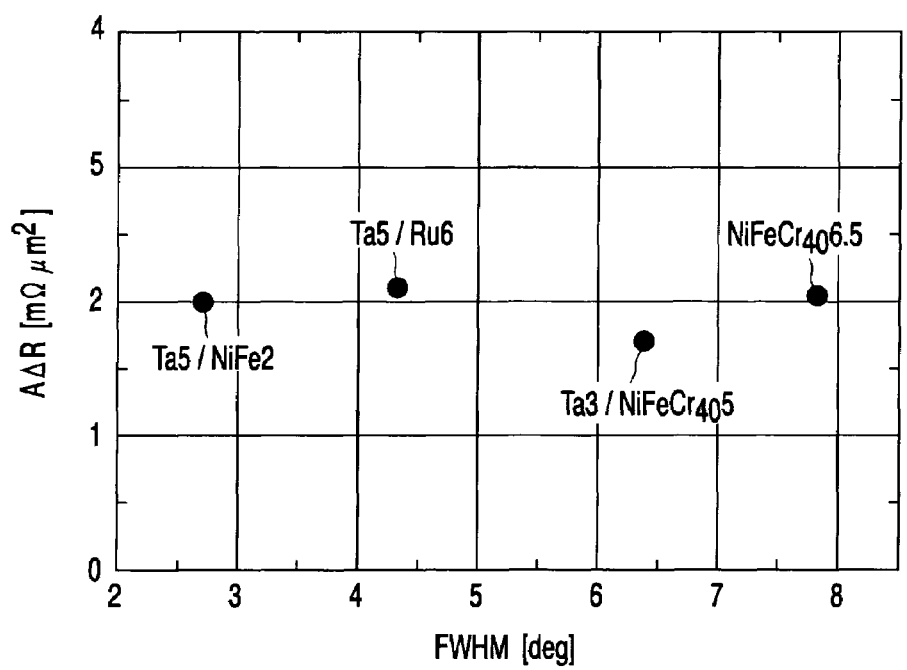
FIG. 4 is a diagram showing the relationship between FWHM and $A\Delta R$.

The crystal orientation of the magnetoresistive elements using these buffer layers was excellent in the order of 1-B, 1-A, 1-C, and 1-D. Each stacked structure was formed on a thermally-oxidized Si substrate, and the relationship between the full width at half maximum (FWHM) of the rocking curve by X-ray diffraction of the spin-valve and the resistance change ($A\Delta R$) per unit area of element was investigated. The results are shown in FIG. 4. The smaller FWHM means the higher crystal orientation. Since the entire resistance of the magnetoresistive element is low relative to the electrode resistance in the case of a magnetoresistive element formed of only metal layers as shown in FIG. 3, comparing the values of $A\Delta R$ is more precise than comparing the values of MR, and thus the values of $A\Delta R$ are plotted in FIG. 4. It can be said from FIG. 4 that the crystal orientation does not correlate with the $A\Delta R$.

Figure 5:
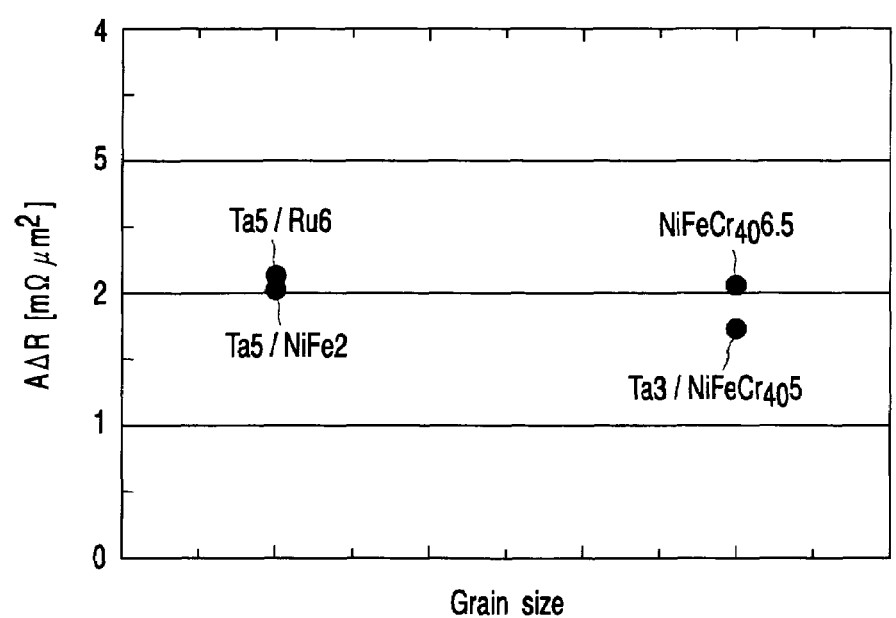
FIG. 5 is a diagram showing the relationship between the grain size and $A\Delta R$.

In the magnetoresistive element shown in FIG. 3, the grain size also depends largely on the buffer layer. From the sectional TEM observation, it has been found that columnar crystals are grown from the buffer layer to the protective layer. Estimated grain size was about 10 to 15 nm for 1-A and 1-B, and about 30 to 40 nm for 1-C and 1-D. FIG. 5 shows the relationship between the grain size and $A\Delta R$ of the spin-valve element. It can be said from FIG. 5 that the grain size does not correlate with the $A\Delta R$.

The magnetoresistive element having the configuration as shown in FIG. 2 was manufactured by using the following materials:
Buffer layer 2: described below.
Antiferromagnetic layer 3: PtMn [15 nm]
First pinned layer 41: $Co_{90}Fe_{10}$ [4 nm]
Anti-parallel coupling layer 42: Ru [1 nm]
Second pinned layer 43: $Fe_{50}Co_{50}$ [5 nm]
First metal layer 51: Cu [0.2 nm]
Resistance increasing layer 52: $AlO_x$ including Cu metal paths [1.0 nm, 1.5 nm, or 2.0 nm]
Second metal layer 53: Cu [0.5 nm]
Free layer 6: $Fe_{50}Co_{50}$ [1 nm]/$Ni_{80}Fe_{20}$ [3.5 nm]
Spin filter layer 7: Cu [1 nm]
Protective layer 8: Ta [20 nm].

The following six materials were used for the buffer layer:
Ta [5 nm]/Ru [6 nm],
Ta [5 nm]/$Ni_{80}Fe_{20}$ [2 nm],
Ta [3 nm]/$(Ni_{80}Fe_{20})_{60}Cr_{40}$ [5 nm],
$(Ni_{80}Fe_{20})_{60}Cr_{40}$ [6.5 nm],
Ta [3 nm]/$(Ni_{80}Fe_{20})_{60}Cr_{40}$ [5 nm]/$(Ni_{80}Fe_{20})_{78}Cr_{22}$ [1 nm], and
Ta [5 nm]/Ru [1 nm]/Cu [2 nm].

Figure 6A:
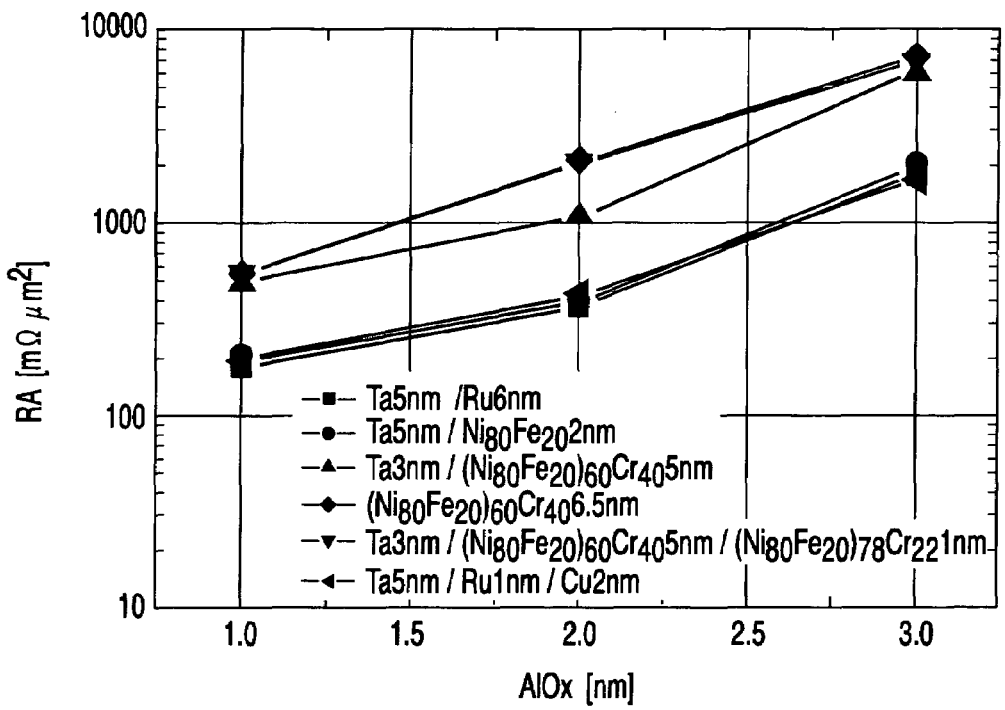
FIG. 6A is a diagram showing the relationship between the thickness of $AlO_x$ of the resistance increasing layer and RA.
Figure 6B:
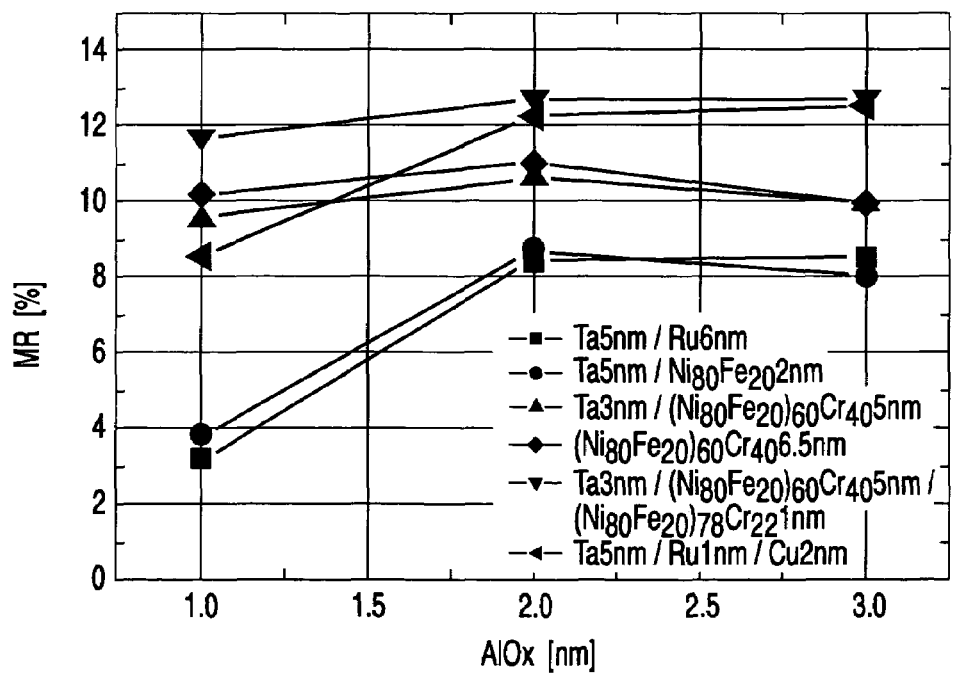
FIG. 6B is a diagram showing the relationship between the thickness of $AlO_x$ of the resistance increasing layer and MR.

FIG. 6A shows the relationship between the thickness of $AlO_x$ of the resistance increasing layer and the resistance-area product RA, and FIG. 6B shows the relationship between the thickness of $AlO_x$ of the resistance increasing layer and MR.

As shown in these graphs, the dependence of RA or MR on the $AlO_x$ thickness differs with the material of the buffer layer. It is estimated that the crystal orientation and grain size of the magnetoresistive element vary depending on the material of the buffer layer.

Figure 7A:
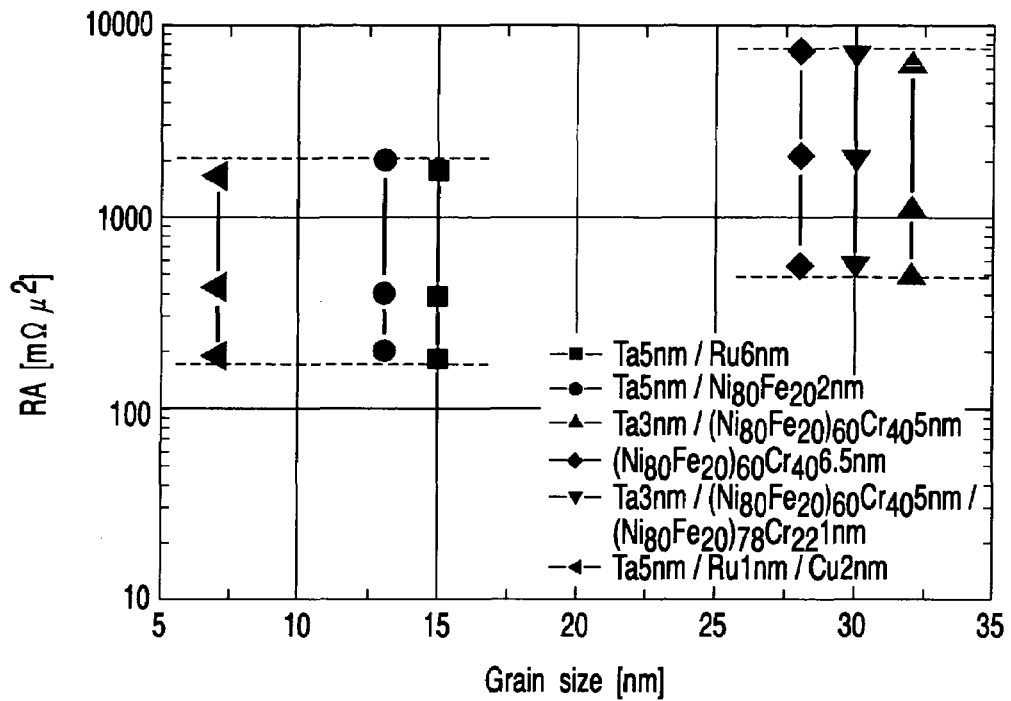
FIG. 7A is a diagram showing the relationship between the grain size and RA.
Figure 7B:
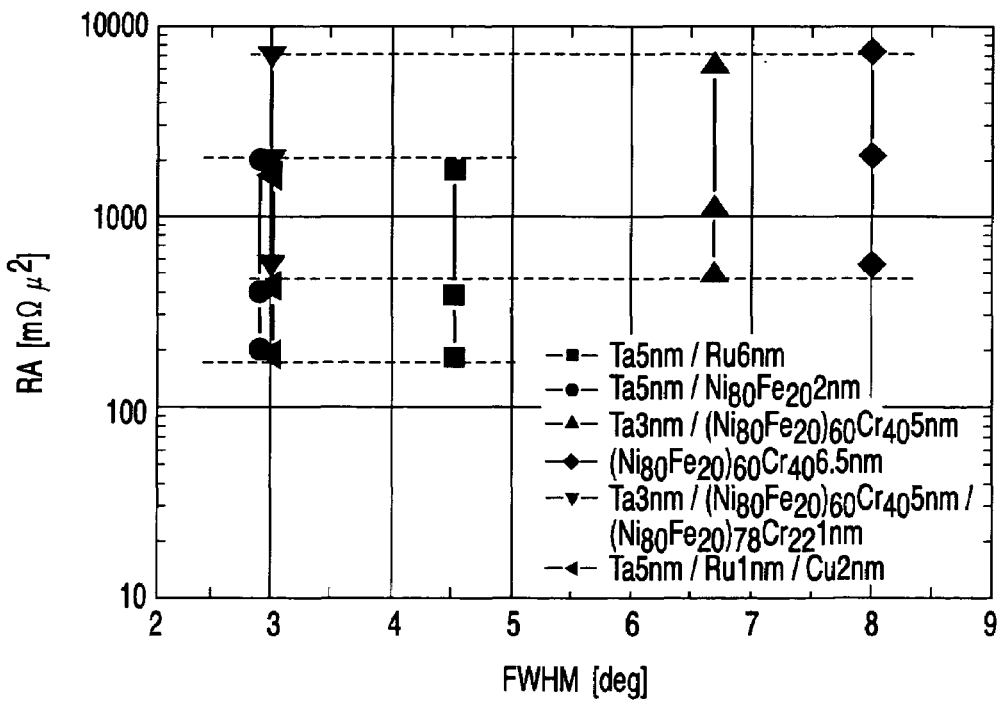
FIG. 7B is a diagram showing the relationship between FWHM and RA.

Then, a study was carried out to examine how the dependence of RA or MR on the $AlO_x$ thickness is varied by the parameters of the crystal orientation and the grain size. As a criterion of the crystal orientation, the FWHM of the rocking curve in X-ray diffraction of the magnetoresistive element was measured. The grain size was estimated by the sectional TEM. FIG. 7A shows the relationship between the grain size and RA, and FIG. 7B shows the relationship between FWHM and RA. FIG. 8A shows the relationship between the grain size and MR, and FIG. 8B shows the relationship between FWHM and MR.

It should be noted that, since crystal growth is interrupted by inserting a resistance adjusting layer including an insulator as shown in FIG. 2, the crystallinity varies between the lower layers under the resistance adjusting layer 52 (layers from the antiferromagnetic layer to the second pinned layer) and the upper layers above the resistance adjusting layer 52 (the free layer and other layers arranged thereon). The crystallinity in the portion just under the resistance adjusting layer 52 is related to formation of the resistance adjusting layer 52. Thus, it is necessary to observe only the crystallinity of the layer under the resistance adjusting layer 52. However, since the orientation determined by the rocking curve of X-ray diffraction reflects the orientation of the entire spin-valve film, it is impossible to discriminate between the orientation of the lower layers and that of the upper layers, which are separated by the resistance adjusting film 52. Without the resistance adjusting layer 52, the crystals of the upper layers grow consecutively on the crystals of the lower layers under the spacer. Accordingly, in FIGS. 7B and 8B, the axis of abscissas denotes the FWHM of a model sample using Cu with a thickness of 3 nm as the spacer without inserting the resistance adjusting film.

Comparing these graphs, it seems that RA is controlled by the grain size, and that MR is controlled by both the grain size and crystal orientation. More specifically, RA tends to be higher when the grain size becomes larger. On the other hand, the behavior of MR is somewhat complicated. In samples of grain size of about 10 to 15 nm, the MR is the lowest. High MR values are realized in the smaller grain size of about 5 nm and in the larger size of about 30 nm. Comparing samples of large grain size, the MR is higher when the crystal orientation is better.

The mechanism of such behavior of RA and MR in relation to the grain size may be interpreted as follows. The reason why the MR is increased as the grain size becomes smaller is supposed that the metal paths are formed easily and the purity of the metal paths is improved. To the contrary, it is supposed that, when the grain size becomes larger, the metal paths are formed sparsely, which makes the RA somewhat higher, but the current confinement effect is more prominent, which makes the MR higher.

The behavior of MR in relation to the crystal orientation may be interpreted as follows. Firstly, in the spin-valve of excellent orientation, it is supposed that the quality of the metal paths is improved. Secondly, it is supposed that the interfaces between the first metal layer 51 and the pinned layer and between the second metal layer 53 and the free layer are formed smoothly, which suppresses spin-independent scattering of electrons.

When these elements are applied to the magnetoresistive head, if the RA is too high, the S/N is worse, making it impossible to use practically. Therefore, it is desired to realize low RA and high MR as much as possible. To this end, it is easier to estimate the superiority by comparing MR at the same level of RA.

Figure 9:
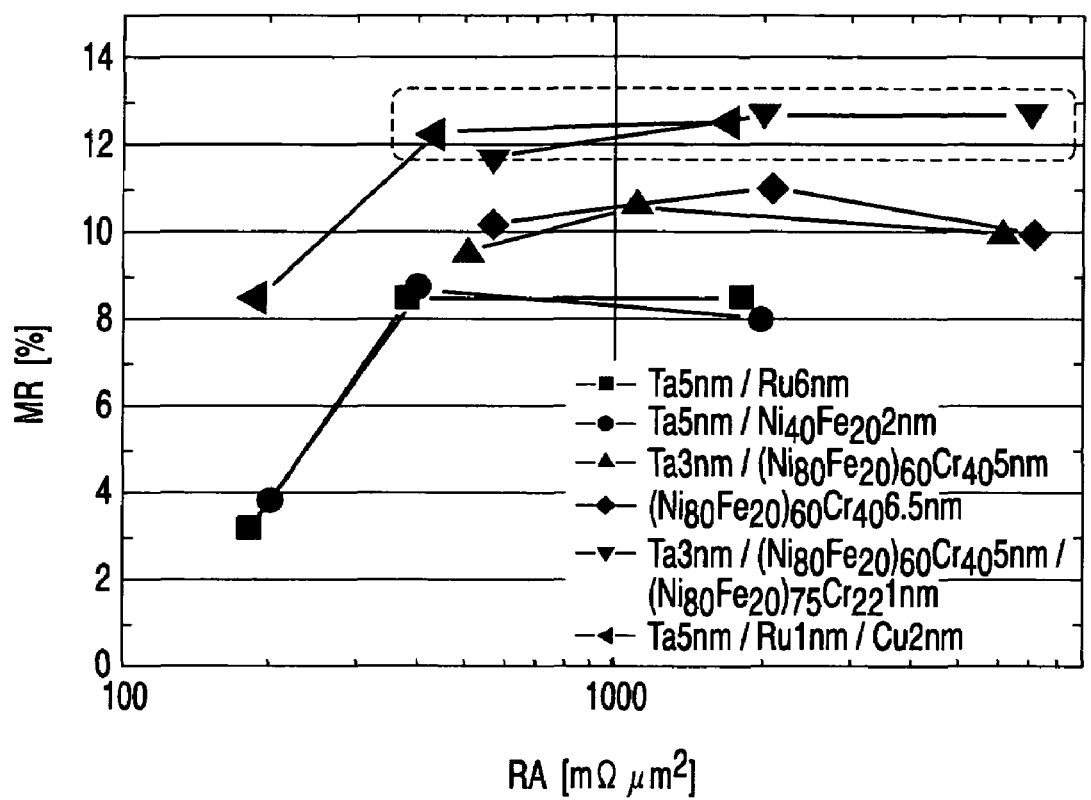
FIG. 9 is a diagram showing the relationship between RA and MR.

FIG. 9 shows the relationship between RA and MR. For example, the RA of about 500 mΩ µm$^2$ is required at the areal recording density of 200 Gbpsi. At this level of RA, the highest MR is obtained in Ta [3 nm]/(Ni$_{80}$Fe$_{20}$)$_{60}$Cr$_{50}$ [5 nm]/(Ni$_{80}$Fe$_{20}$)$_{87}$Cr$_{22}$ [1 nm] with a large grain size and high orientation, and in Ta [5 nm]/Ru [1 nm]/Cu [2 nm] with a small grain size.

Such dependence of RA and MR on the buffer layer was not observed in the magnetoresistive element shown in FIG. 3 having no insulating layer. Therefore, in the spin-valve having the resistance increasing layer as in FIG. 2, it is found that selection of an optimum buffer layer is very important in the case of controlling distribution and purity of the metal paths of the resistance increasing layer and controlling the interfaces between each nonmagnetic metal layer in the vicinity of the resistance increasing layer and the pinned layer or free layer.

The buffer, layer suitable for improving the MR has a grain size of 3 nm to 7 nm, preferably about 5 nm, or a grain size of 25 nm or more, preferably 30 nm or more, and also has an effect of improving crystal orientation.

From such a viewpoint, the buffer layer is desired to have the lowest layer of Ta, the second layer of (Ni$_{100-x}$Fe$_x$)$_{100-y}$Cr$_y$ alloy (15≦x≦25, 30<y≦45) or Ru, and the third layer of (Ni$_{100-x}$Fe$_x$)$_{100-y}$Cr$_y$ alloy (15≦x≦25, 20≦y≦30), Cu or Co$_{100-x}$Fe$_x$ (5<x<15).

Hereinbefore, Fe$_{50}$Co$_{50}$ 3 nm and Fe$_{50}$Co$_{50}$ 1 nm/Ni$_{80}$Fe$_{20}$ 3.5 nm were used for the materials of the second pinned layer 53 and free layer 6, respectively. However, even in the case of using the material for realizing the high MR and low Hc as shown in Example 1, similar effects as above were obtained by selecting the material of the buffer layer.

The resistance adjusting layer brings about similar effects as above when it includes at least two elements selected from the group consisting of Al, Cr, Mg, Hf, Zr, Si, Ta, Ti, V, Mo, W, Au, Ag, Cu, Pt, Nb, Re, Pd, B and C, and comprises an insulator formed of an oxide of a part of the elements.

Figure 10:
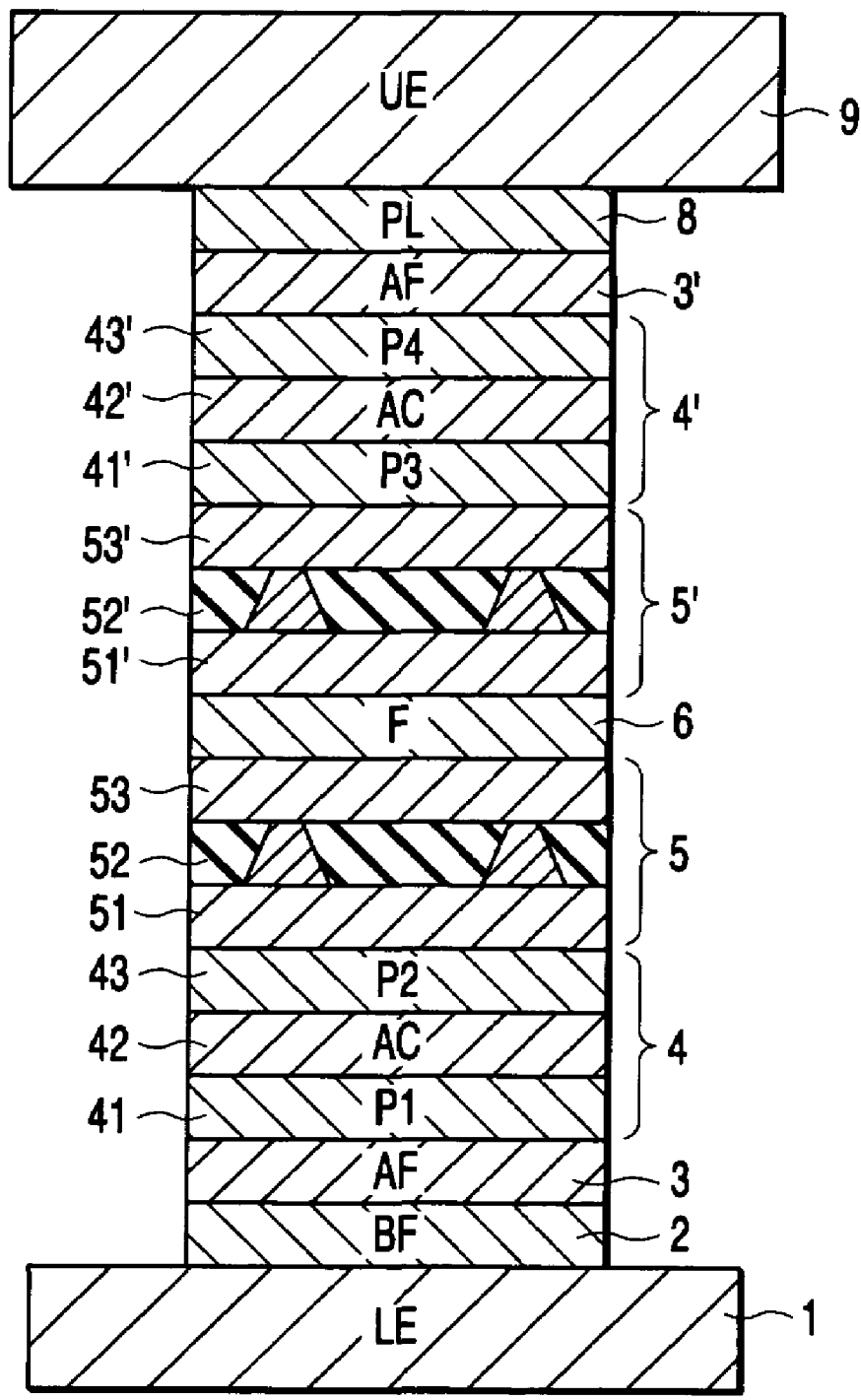
FIG. 10 is a sectional view of a magnetoresistive element in another embodiment of the present invention.

It should be noted that a dual type CPP magnetoresistive element having two set of spacers, second pinned layers and antiferromagnetic layers as shown in FIG. 10 also provides the same effects as in Examples 1 and 2.

The resistance increasing layer including the insulator may be inserted also in another layer of the spin-valve, not limited to the spacer. Also in this case, the MR can be increased by using an appropriate buffer layer and controlling the grain size and crystal orientation.

Third Embodiment

A magnetic reproducing apparatus having the magnetoresistive element according to an embodiment of the present invention mounted thereon will be described. The magnetoresistive element or magnetic head shown in FIG. 2 or 10 can be assembled, for example, in the magnetic head assembly of integrated type, and can be installed in a magnetic recording/reproducing apparatus.

Figure 11:
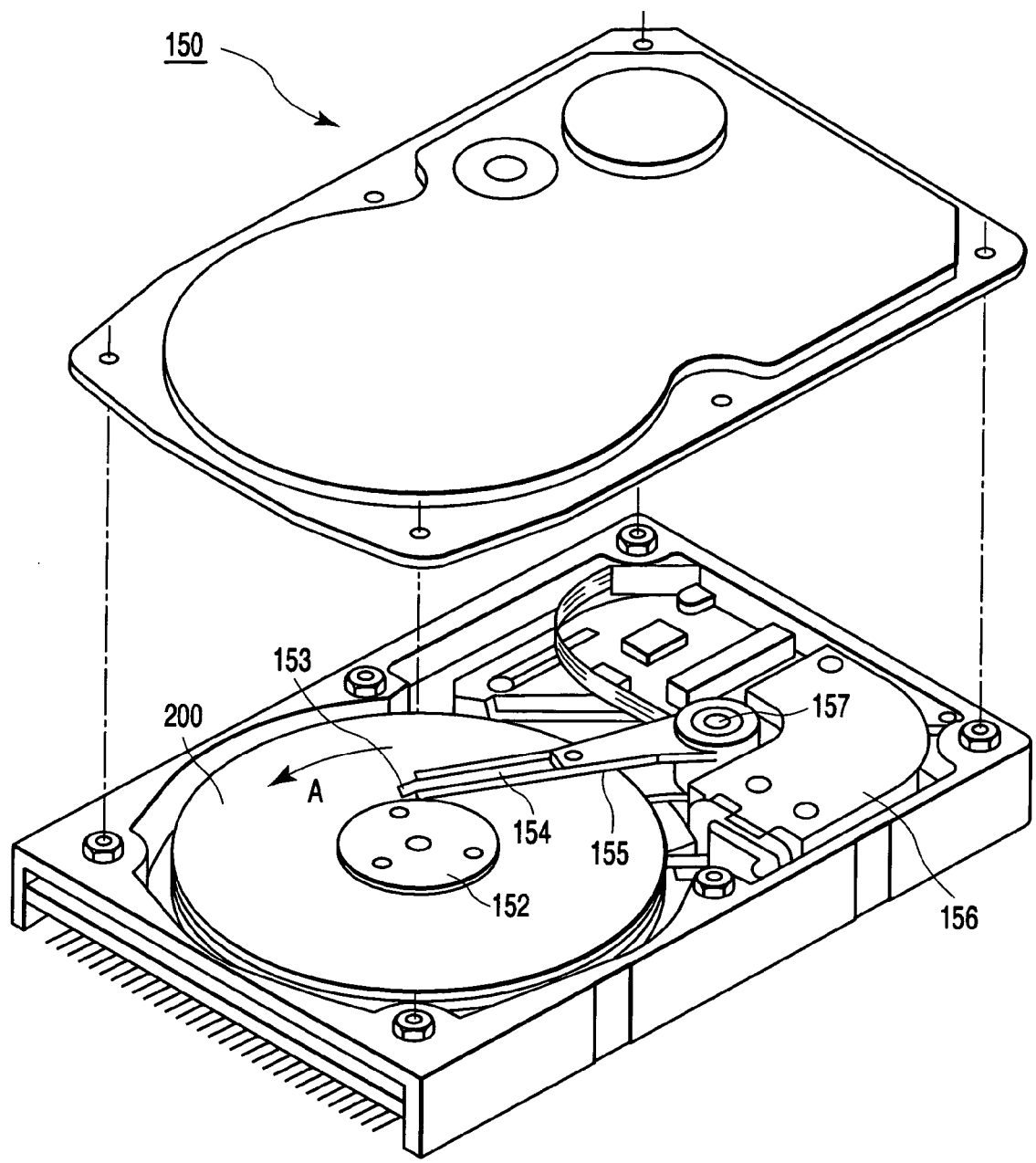
FIG. 11 is a perspective view showing a structure of a magnetic recording/reproducing apparatus according to an embodiment of the present invention.

FIG. 11 is a perspective view showing a structure of such a magnetic recording/reproducing apparatus. The magnetic recording/reproducing apparatus 150 is of a rotary actuator type. In the figure, a recording medium disk 200 is mounted on a spindle 152, and is rotated in direction of the arrow A by a motor (not shown) which responds to control signals from a control unit of a drive controller (not shown). The magnetic recording/reproducing apparatus 150 may comprise a plurality of medium disks 200.

A head slider 153 for writing information to and reading information from the medium disk 200 is mounted on the distal end of a suspension 154. The head slider 153 has the magnetoresistive element or magnetic head of any type of the embodiments formed thereon.

When the medium disk 200 is rotated, the air-bearing surface (ABS) of the header slider 153 is held at a predetermined flying height from the surface of the medium disk 200. Alternatively, the slider may be in contact with the medium disk 200, which is known as "contact type".

The suspension 154 is connected to one end of an actuator arm 155 having a bobbin for holding a driving coil (not shown). At the other end of the actuator arm 155, a voice coil motor 156 which is a type of linear motor is disposed. The voice coil motor 156 is composed of a driving coil (not shown) wound around the bobbin of the actuator arm 155, and a magnetic circuit including a permanent magnet and an opposite yoke disposed to sandwich the coil.

The actuator arm 155 is held by two ball bearings (not shown) disposed at upper and lower positions of a pivot 157, and is free to rotate and slide by means of the voice coil motor 156.

Figure 12:
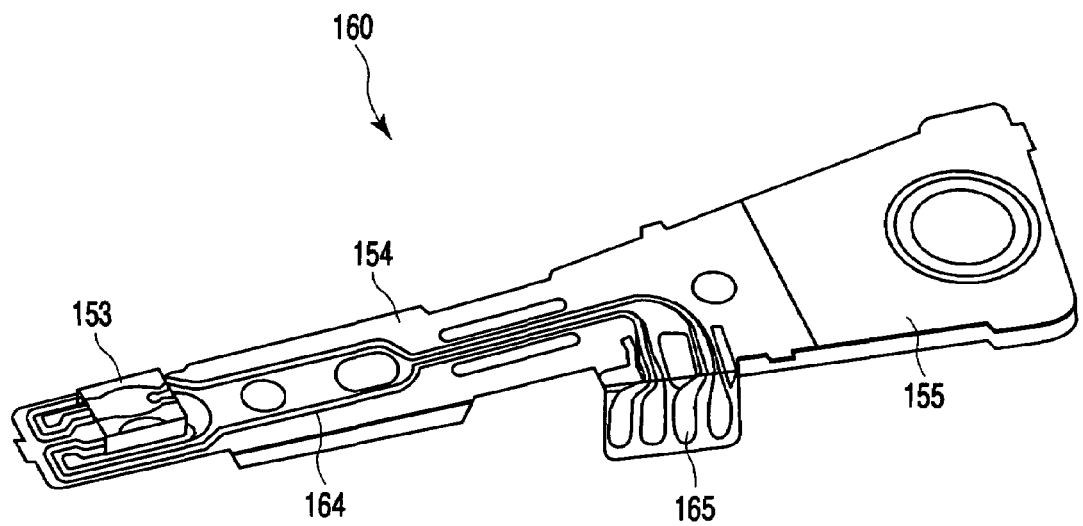
FIG. 12 is a perspective view of a magnetic head assembly according to an embodiment of the present invention.

FIG. 12 is a magnified perspective view of the distal end of the magnetic head assembly including the actuator arm 155 viewed from the disk side. That is, the magnetic head assembly 160, for example, has the actuator arm 155 having the bobbin for holding the driving coil, and the suspension 154 is connected to one end of the actuator arm 155.

At the distal end of the suspension 154, the head slider 153 having the magnetoresistive element or magnetic head shown in FIG. 2 or 10 is mounted. The suspension 154 has lead wires 164 for writing and reading signals, and the lead wires 164 are electrically connected to electrodes of the magnetic head assembled in the head slider 153. Reference numeral 165 in the figure represents electrode pads of the magnetic head assembly 160.

According to the embodiment of the present invention, by assembling the magnetoresistive element or magnetic head shown in FIG. 2 or 10, information magnetically recorded in the medium disk 200 at a higher recording density than prior art can be read out reliably.

Fourth Embodiment

A magnetic memory having a magnetoresistive element according to an embodiment of the present invention mounted thereon will be described. By using the magnetoresistive element of the invention shown in FIG. 2 or 10, a magnetic memory such as magnetic random access memory having memory cells arrayed in matrix can be realized.

Figure 13:
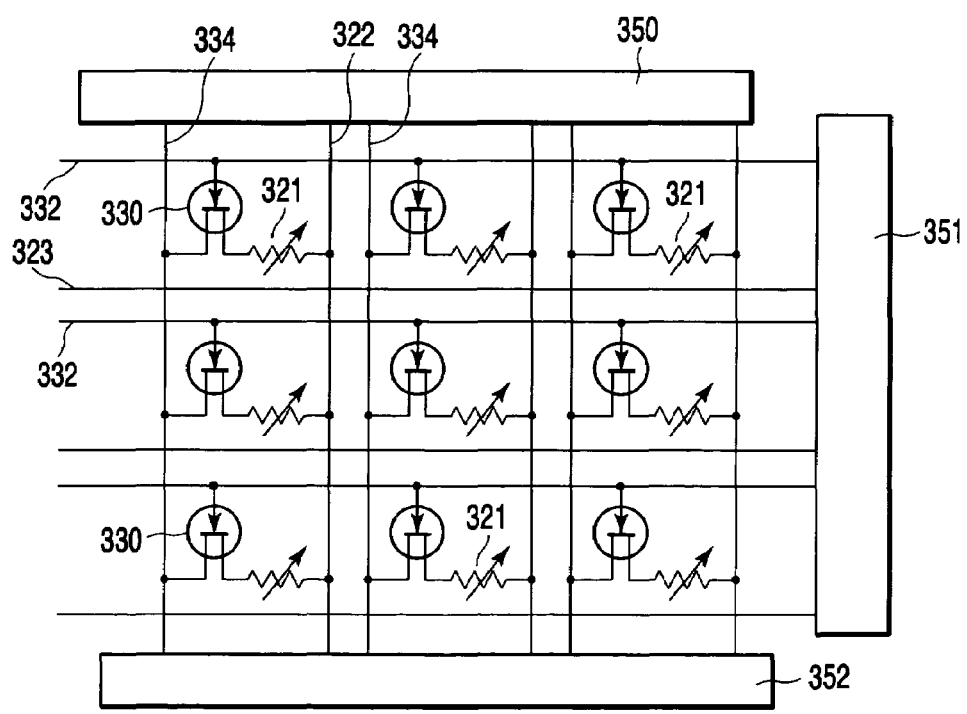
FIG. 13 is a diagram showing a magnetic memory matrix according to an embodiment of the present invention.

FIG. 13 is a diagram showing an example of a matrix structure of the magnetic memory according to an embodiment of the present invention. The diagram shows a circuit configuration of the embodiment in which memory cells are arrayed. A row decoder 350 and a line decoder 351 are provided to select one bit in the array. A switching transistor 330 is selected and turned on by a bit line 334 and a word line 332, and bit information recorded in the magnetic recording layer included in a magnetoresistive element 321 can be read out through detection by a sense amplifier 352. When writing bit information, write current is applied in specified word line 323 and bit line 322 to generate a magnetic field.

The magnetic memory according to the embodiment of the present invention provides a high negative magnetoresistive effect by using the magnetoresistive element shown in FIG. 2 or 10. Therefore, the magnetic domains of the recording layer can be securely controlled if the cell size is reduced, and reliable writing is assured, and reading is also realized securely.

The embodiments of the invention have been described hereinbefore with referring to practical examples. It should be noted, however, that the present invention is not limited to these examples alone. For example, the specific structure, shape and material of the magnetoresistive element can be properly selected from the known range by those skilled in the art, and the present invention may be similarly embodied and same effects can be obtained.

For example, when applying the magnetoresistive element in a magnetic read head, the detection resolution of the magnetic head can be defined by forming magnetic shields above and beneath the element.

The present invention can be also applied in the magnetic head or magnetic reproducing apparatus of a longitudinal magnetic recording system or a perpendicular magnetic recording system, and the same effects can be obtained.

The magnetic reproducing apparatus of the present invention may be either rigid type having a specific rigid recording medium, or removable type having an removable recording medium.

All the magnetoresistive elements, magnetic heads, magnetic reproducing apparatuses, and magnetic memories that can be properly designed and changed by those skilled in the art on the basis of the contents described in the embodiments of the present invention are similarly included in the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a magnetoresistive film comprising: a buffer layer; an antiferromagnetic layer formed on the buffer layer; a magnetization pinned layer, formed on the antiferromagnetic layer, whose magnetization is substantially pinned to one direction; a nonmagnetic intermediate layer formed on the magnetization pinned layer; and a magnetization free layer, formed on the nonmagnetic intermediate layer, whose magnetization is changed in direction depending on an external magnetic field; and a pair of electrodes electrically connected to the magnetoresistive film so as to supply a sense current in a direction substantially perpendicular to a plane of the magnetoresistive film, wherein the buffer layer comprises three layers selected from the group consisting of a Ta layer, $(Ni_{100-x}Fe_x)_{100-y}Cr_y$ alloy layer ($15 \leq x \leq 25$, $20 \leq y \leq 30$), $(Ni_{100-x}Fe_x)_{100-y}Cr_y$ alloy layer ($15 \leq x \leq 25$, $30 < y \leq 45$), Cu layer, Ru layer, and $Co_{100-x}Fe_x$ layer ($5 < x < 15$), and wherein the nonmagnetic intermediate layer includes at least two elements selected from the group consisting of Al, Cr, Mg, Hf, Zr, Si, Ta, Ti, V, Mo, W, Au, Ag, Cu, Pt, Nb, Re, Pd, B and C, and comprises an insulator formed of an oxide of a part of the elements and current paths penetrating the insulator and formed of another part of the elements, and wherein the magnetization free layer comprises a body-centered cubic layer with a body-centered cubic structure, the body-centered cubic layer having a thickness of 2 nm or more.

2. The magnetoresistive element according to claim 1, wherein the magnetization free layer is formed of a $(Fe_{100-x}Co_x)_{100-y}Ni_y$ layer ($0 \leq x \leq 85$, $0 \leq y \leq 50$) or a stacked film of a $(Fe_{100-x}Co_x)_{100-y}Ni_y$ layer ($0 \leq x \leq 85$, $0 \leq y \leq 50$) and a $Ni_{100-x}Fe_x$ layer ($15 \leq x < 25$), and wherein the $(Fe_{100-x}Co_x)_{100-y}Ni_y$ layer is in contact with the nonmagnetic intermediate layer.

3. The magnetoresistive element according to claim 1, wherein the magnetization free layer is formed of a $\{(Fe_{100-x}Co_x)_{100-y}Ni_y\}_{100-z}M1_z$ layer ($0 \leq x \leq 85$, $0 \leq y \leq 50$, $0 < z < 10$, where M1 is at least one selected from the group consisting of Cu, Au, Ag, Pt, Re and B) or a stacked film of a $\{(Fe_{100-x}Co_x)_{100-y}Ni_y\}_{100-z}M1_z$ layer ($0 \leq x \leq 85$, $0 \leq y \leq 50$, $0 < z < 10$, where M1 is at least one selected from the group consisting of Cu, Au, Ag, Pt, Re and B) and a $(Ni_{100-x}Fe_x)_{100-z}M2_z$ ($15 \leq x \leq 25$, $0 < z < 10$, where M2 is at least one selected from the group consisting of Cu, Au, Ag, Pt, Re and B), and wherein the $\{(Fe_{100-x}Co_x)_{100-y}Ni_y\}_{100-z}M1_z$ layer is in contact with the nonmagnetic intermediate layer.

4. The magnetoresistive element according to claim 1, wherein the magnetization free layer is formed of ferromagnetically-coupled $(Fe_{100-x}Co_x)_{100-y}Ni_y$ layers ($0 \leq x \leq 85$, $0 \leq y \leq 50$) and at least one M1 metal layer (where M1 is at least one selected from the group consisting of Cu, Au, Ag, Pt, Re and B) inserted between the ferromagnetically-coupled $(Fe_{100-x}Co_x)_{100-y}Ni_y$ layers, or a ferromagnetically-coupled stacked film of at least one $(Fe_{100-x}Co_x)_{100-y}Ni_y$ layer ($0 \leq x \leq 85$, $0 \leq y \leq 50$), at least one $Ni_{100-x}Fe_x$ layer ($15 \leq x < 25$) and at least one M1 metal layer (where M1 is at least one selected from the group consisting of Cu, Au, Ag, Pt, Re and B) inserted between the $(Fe_{100-x}Co_x)_{100-y}Ni_y$ layer and the $Ni_{100-x}Fe_x$ layer, and wherein the $(Fe_{100-x}Co_x)_{100-y}Ni_y$ layer is in contact with the nonmagnetic intermediate layer.

5. The magnetoresistive element according to claim 1, wherein the nonmagnetic intermediate layer includes at least two elements selected from the group consisting of Al, Cr, Mg, Hf, Zr, Si, Ta, Ti, V, Mo, W, Au, Ag, Cu, Pt, Nb, Re, Pd, B and C, and wherein the nonmagnetic intermediate layer comprises an insulator formed of an oxide of one of the at least two elements and current paths penetrating the insulator and formed of the other of the at least two elements.

6. The magnetoresistive element according to claim 1, wherein the buffer layer includes a Ta layer, a second layer of $(Ni_{100-x}Fe_x)_{100-y}Cr_y$ alloy layer ($15 \leq x \leq 25$, $30 < y \leq 45$) or Ru layer, and a third layer of $(Ni_{100-x}Fe_x)_{100-y}Cr_y$ alloy layer ($15 \leq x \leq 25$, $20 \leq y \leq 30$), Cu layer or $Co_{100-x}Fe_x$ layer ($5 < x < 15$), the Ta layer being disposed distant from the antiferromagnetic layer, the third layer being disposed near the antiferromagnetic layer, and the second layer being disposed between the Ta layer and the third layer.

7. A magnetic head comprising the magnetoresistive element according to claim 1.

8. A magnetic reproducing apparatus comprising the magnetic head according to claim 7, and adapted to read information magnetically recorded in a magnetic recording medium.

9. A magnetic memory comprising a plurality of the magnetoresistive elements according to claim 1.

* * * * *